United States Patent [19]

Lee et al.

[11] Patent Number: 4,851,886
[45] Date of Patent: Jul. 25, 1989

[54] BINARY SUPERLATTICE TUNNELING DEVICE AND METHOD

[75] Inventors: Jhang W. Lee, Richardson; Mark A. Reed, Dallas, both of Tex.

[73] Assignee: Texas Instruments Incorporated, Dallas, Tex.

[21] Appl. No.: 872,795

[22] Filed: Jun. 11, 1986

[51] Int. Cl.$^4$ ............... H01L 27/12; H01L 29/161
[52] U.S. Cl. ......................................... 357/4; 357/16
[58] Field of Search ................ 357/16, 4, 4 SL, 12, 357/14

[56] References Cited

U.S. PATENT DOCUMENTS

| | | | |
|---|---|---|---|
| 4,163,238 | 7/1979 | Esaki et al. | 357/16 |
| 4,439,782 | 3/1984 | Holonyak et al. | 357/16 |
| 4,598,164 | 7/1986 | Tiedje et al. | 357/15 |
| 4,620,206 | 10/1986 | Ohta et al. | 357/16 |
| 4,645,707 | 2/1987 | Davies et al. | 357/4 |
| 4,721,983 | 1/1988 | Frazier | 357/4 |

OTHER PUBLICATIONS

Masselink et al, "Improved GaAs/AlGaAs Single Quantum Wells through the Use of Thin Superlattice Buffers", Applied Physics Letters, pp. 435 to 437, Feb. 15, 1984.

*Primary Examiner*—Andrew J. James
*Assistant Examiner*—Ngan V. Ngo
*Attorney, Agent, or Firm*—Carlton H. Hoel; James T. Comfort; Melvin Sharp

[57] ABSTRACT

A resonant tunneling diode (30) with anode (40) and cathode (32) separated by binary short-period superlattice tunneling barriers (34,38) with a quantum well (36) between is disclosed. Enhancement and depletion mode diodes are disclosed.

5 Claims, 6 Drawing Sheets 132 134 136 138 140

BINARY SUPERLATTICE TUNNELING DEVICE AND METHOD

STATEMENT AS TO RIGHTS TO INVENTIONS MADE UNDER FEDERALLY SPONSORED RESEARCH AND DEVELOPMENT

The U.S. Government has a paid-up license in this invention and the right in limited circumstances to require the patent owner to license others on reasonable terms as provided for by the terms of Contract No. N00014-84-C-0125 awarded by the U.S. Navy.

BACKGROUND OF THE INVENTION

1. Field of the Invention

The present invention relates to electronic semiconductor devices, and, more particularly, to quantum well devices in which carrier resonant tunneling through the well is modulated.

2. Description of the Related Art

Quantum well devices are known in various forms, heterostructure lasers being a good example. Quantum well heterostructure lasers rely on the discrete energy levels in the quantum wells to achieve high efficiency and typically consist of a few coupled quantum wells; see, generally, Sze, Physics of Semiconductor Devices, 729–730 (Wiley Interscience, 2d Ed 1981). High Electron Mobility Transistors (HEMTs) are another type of quantum well device and typically use only one half of a quantum well (a single heterojunction) but may include a stack of a few quantum wells. The HEMT properties arise from conduction parallel to the heterojunctions and in the quantum well conduction or valence subbands; the conduction carriers (electrons or holes) are isolated from their donors and this isolation limits impurity scattering of the carriers. See, for example, T. Drummond et al, Electron Mobility in Single and Multiple Period Modulation-Doped (Al,Ga)As/GaAs Heterostructures, 53 J.Appl.Phys.1023 (1982). Superlattices consist of many quantum wells so tightly coupled that the individual wells are not distinguishable, but rather the wells become analogous to atoms in a lattice. Consequently, superlattices behave more like new types of materials than as groups of coupled quantum wells; see, generally, L. Esaki et al, Superfine Structure of Semiconductors Grown by Molecular-Beam Epitaxy, CRC Critical Reviws in Solid State Sciences 195 (April 1976). Superlattices have been used as quantum well barriers to improve the well-barrier interface by lessening trapping of undesirable impurities and preventing surface roughening during growth; see the photoluminescence studies of H. Sakaki et al, Energy Levels and Electron Wave Functions in Semiconductor Quantum Wells Having Superlattice Alloy like Material (0.9 nm GaAs/0.9 nm AlGaAs) as Barrier Layers, 47 Appl.-Phys.Lett. 295 (1985) and K. Fujiwara et al, 24 Jpn.J.Appl.Phys. Part 2 L405 (1985).

Resonant tunneling devices are the simplest quantum well devices that exhibit quantum confinement and coupling and were first investigated by L. Chang et al, 24 Appl.Phys.Lett. 593 (1974), who observed weak structure in the current-voltage characteristics of resonant tunneling diodes at low temperatures. More recently, Sollner et al, 43 Appl.Phys.Lett. 588 (1983), have observed large negative differential resistance in such devices (peak-to-valley rats as large as six to one have been obtained), and Shewchuk et al, 46 Appl.-Phys.Lett. 408 (1985) and M. Reed et al, J.Mat.Res. (1986), have demonstrated room temperature resonant tunneling.

A typical resonant tunneling diode structure is schematically illustrated in FIGS. 1A–D; FIG. 1A is a schematic cross sectional view, FIG. 1B illustrates the profile of the conduction band edge through such a diode with no bias, FIG. 1C is the conduction band edge for bias into resonance, and FIG. 1D is a typical current-voltage characteristic for the diode at low temperature. The preferred material is the lattice matched system of $GaAs/Al_xGa_{1-x}As$, although resonant tunneling has been observed in strained-layer heterostructure systems; see Gavrilovic et al, 52 Solid State Comm. 237 (1984). The two $Al_xGa_{1-x}As$ layers that define the central GaAs quantum well (see FIGS. 1B–C) serve as partially transparent barriers to electron transport through the diode. Resonant tunneling occurs when the bias across the outer terminals is such that one of the quantum well bound states has approximately the same energy level as the input electrode Fermi level. This is illustrated by the arrows in FIG. 1C. Peaks in the electron transmission (current) as a function of bias (voltage) are thus observed. The resonant tunneling diode is the electrical analog of a Fabry-Perot resonantor. Leakage (inelastic tunneling current) is determined by the quality of the $GaAs/Al_xGa_{1-x}As$ interfaces and electron-phonon scattering.

The resonant tunneling diode has high speed charge transport (less than 100 femtoseconds) which implies applications to microwave oscillators and high speed switches. But the utility of such diodes is limited by inelastic tunneling and scattering in the tunneling barriers which degrade performance.

Also, quantum well devices are typically grown layer by layer with molecular beam epitaxy (MBE) or metal organic chemical vapor deposition (MOCVD), and the substrate temperature during such growth leads to the diffusion of doping impurities into the undoped tunneling barriers and well and consequent performance decline. Further, MBE and MCVD have difficulty with control of the alloy composition (the x) in $Al_xGa_{1-x}As$ growth, which is another source of performance degradation.

Thus known resonant tunneling diodes have the problems of interface imperfections and alloy scattering by alloy barriers, and fabrication problems of alloy composition control and doping impurity diffusion from the heavily doped electrodes through the barriers.

SUMMARY OF THE INVENTION

The present invention provides quantum well resonant tunneling devices made with binary superlattice tunneling barriers. Preferred embodiments include diodes with GaAs quantum well and anode and cathode and with AlAs-GaAs short period superlattice tunneling barriers each consisting of five 5.6 Å thick layers: three AlAs layers alternating with two GaAs layers. No $Al_xGa_{1-x}As$ alloy appears in the devices; the short period superlattice barriers are all binary. Binary superlattice tunneling barriers are simpler and more precise to grow than ternary alloy tunneling barriers, avoid alloy scattering, limit impurity diffusion, and provide better interfaces than alloys.

This solves the problems of interface imperfections, alloy scattering, doping impurity diffusion, and alloy composition control.

DESCRIPTION OF THE PREFERRED EMBODIMENTS

Figure 2:
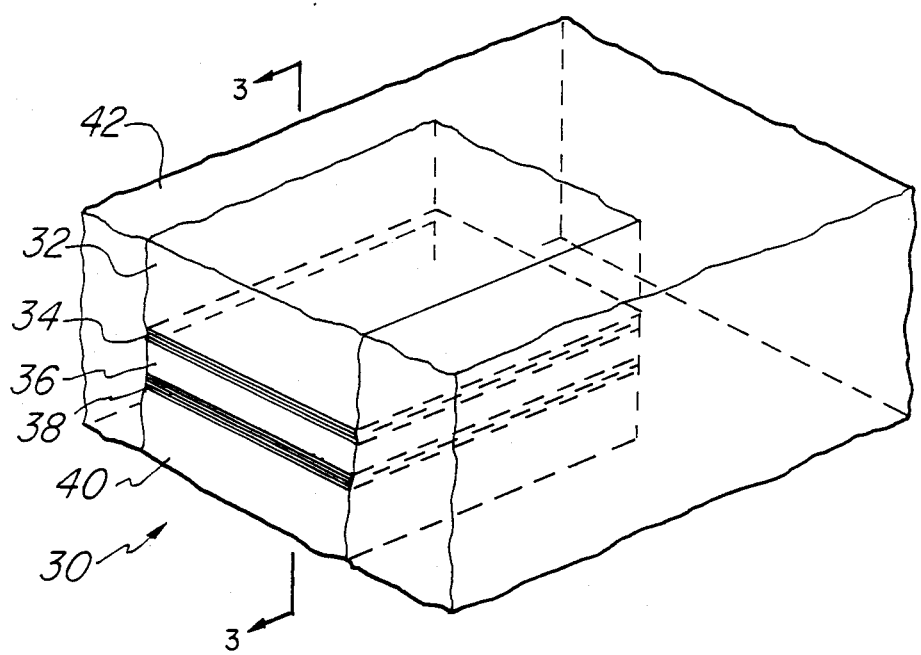
FIG. 2 is a perspective view of a first preferred embodiment resonant tunneling diode.
Figure 3:
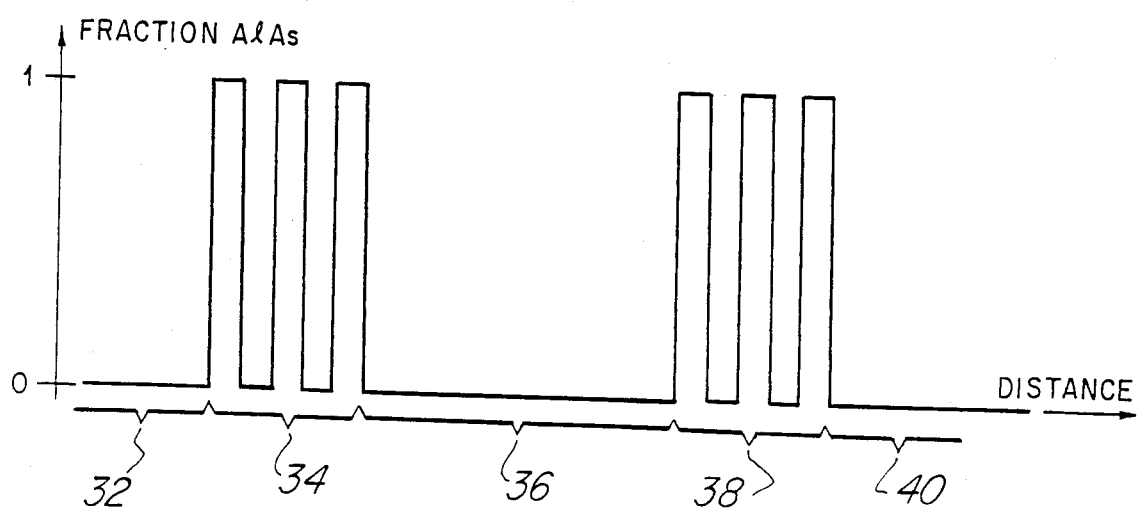
FIG. 3 is composition profile along line 3—3 of FIG.2.

A first preferred embodiment resonant tunneling diode, generally denoted 30, is illustrated in schematic cutaway perspective view in FIG. 2, is single crystal semiconductor and includes n++ GaAs layer 32, undoped short-period binary superlattice 34, undoped GaAs quantum well 36, undoped short-period superlattice 38, n++ GaAs layer 40, and insulation 42. Gold:germanium/nickel/gold contacts to layers 32 and 40, together with leads to the contacts, passivation, and other packaging are not shown for clarity. These layers and regions are most conveniently referred to by the names of analogous structure; thus region layer 32 will be called the cathode, layer 40 the anode, layer 36 the well, and layers 34 and 38 the tunneling barriers. Layers 32, 34, 36, 38, and 40 all have a common square cross section of about 10 microns by 10 microns but with thicknesses as follows: well 36 is 50 Å, tunneling barriers 34 and 38 are each 28 Å, and anode 40 and cathode 32 are both of any convenient size such as 1 micron. Tunneling barriers 34 and 38 are each composed of five sublayers: 5.6 Å of AlAs, then 5.6 Å of GaAs, then 5.6 Å of AlAs, then 5.6 Å of GaAs, and lastly 5.6 Å of AlAs; and these sublayers are all undoped. The layers are all oriented (100) and the 5.6 Å corresponds to two molecular layers. FIG. 3 is a composition profile along line 3—3 of FIG. 2 and shows the fraction AlAs relative to GaAs as a function of distance through diode 30.

Figure 4A:
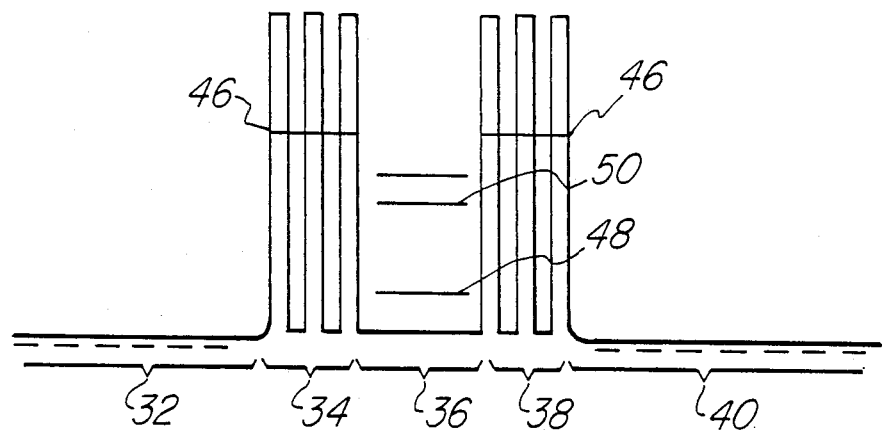
FIGS. 4A-B are conduction band edge diagrams along line 3—3 of FIG.2 for no bias and resonance bias.
Figure 4B:
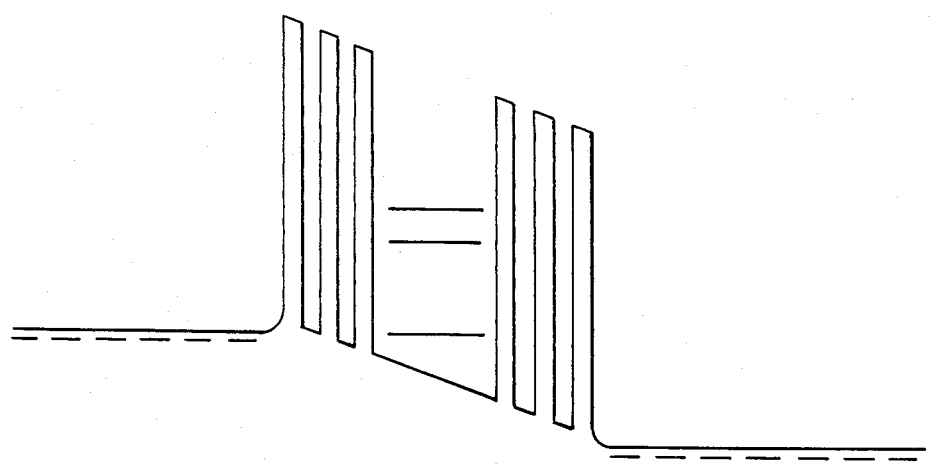
Figure 5A:
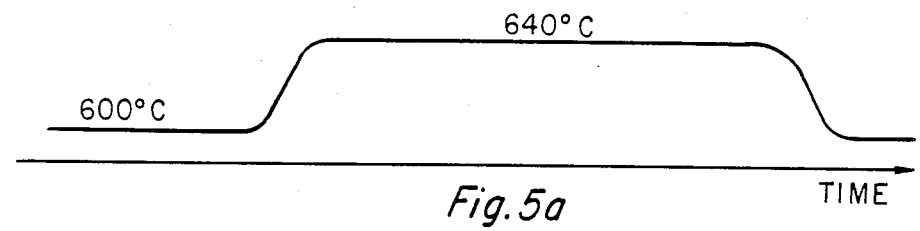
FIGS. 5A-D and FIGS. 6A-C illustrate the first preferred embodiment method of fabrication of a resonant tunneling diode.
Figure 5B:
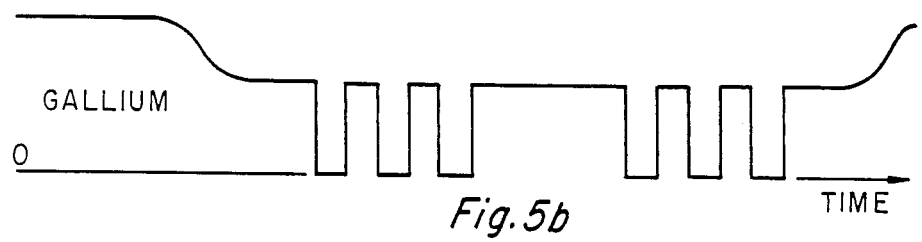
Figure 5C:
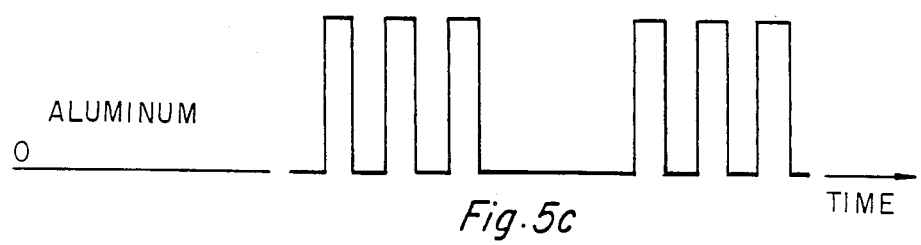
Figure 5D:
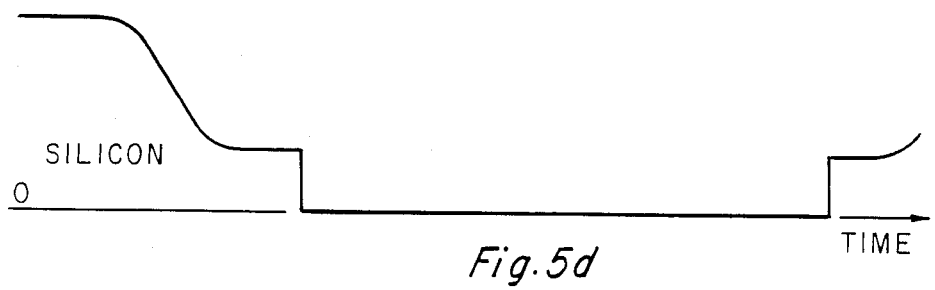

FIG. 4A is an energy level diagram showing the lowest conduction band edge and Fermi level along the line 3—3 of FIG. 2—2 with no bias applied, and FIG. 4B the same band edge and Fermi level with a bias of about 250 mV applied between anode 40 and cathode 32. As indicated in FIGS. 4A-B, the conduction band direct gap discontinuity at the interfaces of the AlAs and GaAs layers is about 0.92 eV (920 meV) Note that this number was derived by using the generally accepted partition of the bandgap difference between GaAs and AlGaAs into 60% appearing as a conduction band discontinuity and 40% as a valence band discontinuity. As will be apparent from the following discussion, the partition has no particular effect on the operation of device 30 beyond adjusting the numbers.

Tunneling barriers 34 and 38 are short-period superlattices, so the effective barrier height of tunneling barriers 34 and 38 is the height of the bottom edge of the lowest miniband which is indicated by reference numeral 46 in FIGS. 4A-B. This height is roughly 600 meV; note that the effective barrier height of short-period $Al_xGa_{1-x}As$ superlattices appears to be lower than the barrier height of a corresponding alloy barrier of composition equal to the average composition of the superlattice. To calculate this effective barrier height and the subband levels in well 36, we would use the effective mass approximation for an electron in the conduction band which presumes the electronic wavefunction is the product of the Bloch function at the bottom of the conduction band and an envelope function of the form:

$$\zeta(x) e^{i(yk_y + zk_x + xk_x)}$$

where the wave vectors $k_y$ and $k_z$ are measured relative to the conduction band edge, $k_x$ depends on $k_y$ and $k_z$, and $\zeta(x)$ is a solution of the eigenvalue equation:

$$-\frac{\hbar^2}{2m} \zeta(x)'' - e\phi(x)\zeta(x) = E\zeta(x).$$

The electrostatic potential is $\phi(x)$, and E is the eigenvalue corresponding to $\zeta(x)$. This models the potential energy of the electron $(-e\phi(x))$ as equal the conduction band edge including the oscillatory behavior in tunneling barriers 34 and 38, with the electrostatic field generated by other electrons in the same or other subbands in well 36 in the conduction band accounted for by band bending. The Bloch function in AlAs will be taken to be of the same form as in GaAs.

The next calculation finds the approximate lowest energy eigenvalues for an electron in the potential well 36. Well 36 is a potential well in the x direction only, and thus the discrete energy levels (eigenvalues E) calculated for $k_y$ and $k_z$ equal zero will in fact be the bottoms of subbands with almost a continuum of levels corresponding to increasing $k_y$ and $k_z$ due the large y and z dimensions. The effective mass approximation at the bottom edge of a subband presumes parabolic subband edges (kinetic energy is a quadratic function of wavevector), so the kinetic energy of an electron with wave vector $(k_x, k_y, k_z)$ is $$\frac{(\hbar k_x)^2}{2m_l} + \frac{(\hbar k_y)^2 + (\hbar k_z)^2}{2m_t}$$

where $m_l$ is the effective mass in the x (longitudinal) direction and $m_t$ the effective mass in the y-z (transverse) directions. For calculations, taking both $m_l$ and $m_t$ equal to 0.067 times the rest mass of an electron amounts to using the bulk GaAs lower valley effective mass.

Now, consider the wavefunction of a single electron in the lowest energy subband in well 52; this corresponds to a solution $\zeta(x)$ with $-e\phi(x)$ the square well 52 and E the smallest such eigenvalue. We can approximate the wavefunction as follows:

$$\Psi_0(x, y, z; k_x, k_y, k_z) = \begin{cases} Au(.) \, e^{i(yk_y + zk_z)} \, e^{xk_1} & x \leq 0 \\ Bu(.) \, e^{i(yk_y + zk_z)} \sin(xk_2 + c) & 0 \leq x \leq 50A \\ Cu(.) \, e^{i(yk_y + zk_z)} \, e^{-xk_3} & 50A \leq x \end{cases}$$

where $A, B, C, c, k_1, k_2, k_3$ are determined by matching boundary conditions, $u(.)$ is the Bloch function, $k_y$ and $k_z$ are the wave vectors in the y and z directions, and $k_1$, $k_2$, $k_3$ are the x wave vectors in the three layers 34, 36, and 38; note that the origin for the x coordinate has been taken to be at the interface of layers 34 and 36 for convenience, and that $k_1$, $k_2$, $k_3$ will be the lowest of a discrete plus continuous set of possible solutions for each $k_y$, $k_z$ pair. Also note that the potentials from tunneling barriers (short-period superlattices) 34 and 38 have been approximated by constant potentials of infinite extent and equal to the effective barrier height; and that the electron spin has been suppressed.

The ground state energy (unexcited level, bottom of the lowest subband edge) for well 36 lies at approximately 125 meV above the conduction band edge (that is, the lowest subband bottom edge is 125 meV above the band edge) and is indicated by reference numeral 48 in FIG. 4A, with the first excited state lying at roughly 300–400 meV and indicated by reference numeral 50. Above this, the higher states deviate from the quadratic increase in energy of an infinite well and begin to cluster due to the proximity (in energy) of the effective top of the barriers. See FIGS. 4A–B for an indication of the lower energy levels.

Figure 1A:
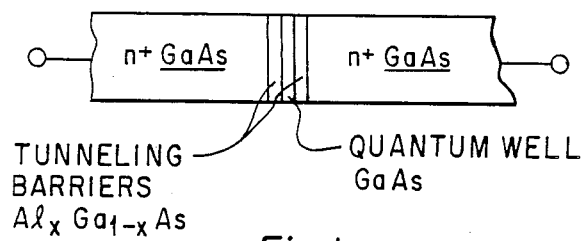
FIGS. 1A-D schematically illustrate a resonant tunneling diode.
Figure 1B:
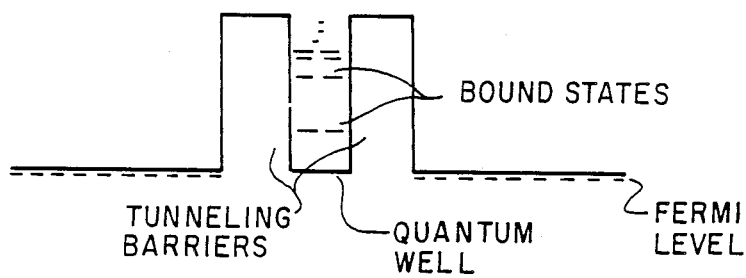
Figure 1C:
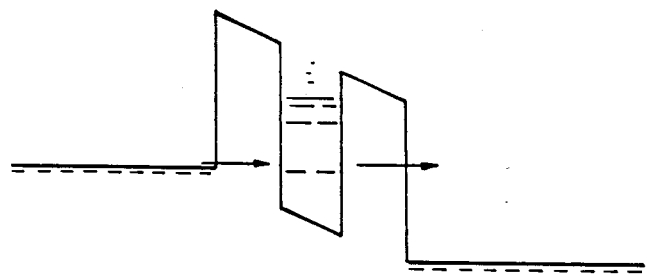
Figure 1D:
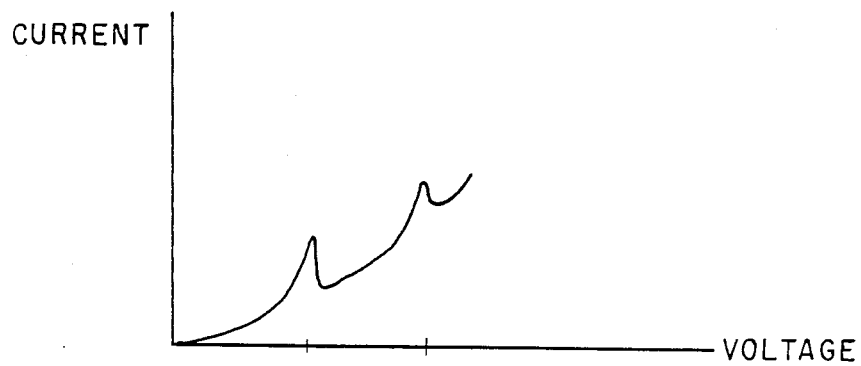

The operation of diode 30 can now be described. Initially consider a small (less than 10 mV) negative bias of cathode 32 relative to anode 40. The electrons in the conduction band of cathode 32 are primarily concentrated near the band edge which has wavevector zero. Thus the envelope functions have wavelengths larger than the thicknesses of tunneling barriers 34 and 38 and well 36, and reflections at the interfaces have little constructive or destructive interference and the exponential attentation in the barriers dominates. So the probability of conduction band electrons from cathode 32 tunneling through barrier 34, traversing well 36, and then tunneling through barrier 38 is roughly the same as electrons tunneling through a barrier of the same height as barriers 34 and 38 and of thickness equal to the sum of thicknesses of barriers 34 and 38. This implies for small bias and low energies the tunneling current should have a functional dependence on the bias of the form of a product of quadratic and exponential terms. As the bias is increased, the kinetic energy of the tunneling electrons while in well 36 increases due to the lowering of the conduction band edge in well 36 relative to the conduction band edge in cathode 32 (this increase appears as an increase in $k_x$ alone because the potential discontinuity is in the x direction). The reflections from the interfaces become significant and with increasing bias eventually resonance occurs for tunneling electrons with wavevectors near zero in cathode 32. This occurs when the lowest subband edge in well 36 aligns with the conduction band edge in cathode 32 (as illustrated in FIG. 4B) which means that the $k_x$ of the tunneling electrons just equals the eigenvalue $k_x$ for the bound level in well 36. Of course, for electrons in cathode 32 with large wavevectors (hot electrons), resonance occurs with lower bias. With further increase of bias the resonance is disrupted, and the current drops as illustrated in FIG. 1D until resonance with the second bound level in well 36 occurs, and so forth for higher resonances.

Diode 30 is symmetric so negative bias behavior is just the same as the previously described but with the anode and cathode switched.

Figure 6A:
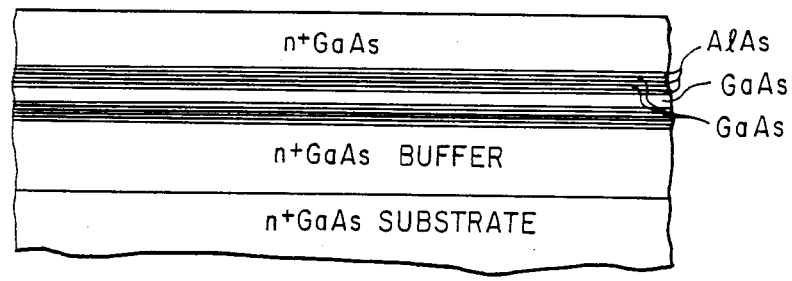

Diode 30 is fabricated by the following steps of the first preferred embodiment method:

(a) A substrate of single crystal GaAs oriented (100) and n+ doped with silicon is processed by molecular beam epitaxy (MBE) as illustrated in FIGS. 5A–D which show as a function of time (A) the substrate temperature varying between 600° and 640° C. with the higher temperatures for the short-period superlattice and well growth, (B) the gallium cell effusion rate showing an initial high rate (higher cell temperature) for growing a buffer GaAs layer of about 3,000 Å followed by a lower rate for the quantum well and with shutter openings and closings for the short-period superlattice tunneling barriers and then back to the high rate for a GaAs capping layer, (C) the aluminum cell effusion rate which is zero except for the shutter openings and closings to grow the short-period superlattice (D) the silicon cell effusion rate showing the n+ doping of the GaAs to form the anode and cathode, note that the doping is about $1 \times 10^{18}/cm^3$ up to within 500 Å of the tunneling barriers and then ramps down to about $1 \times 10^{16}/cm^3$ at a distance of 15 Å from the tunneling barriers at which point the cell shutter is closed. The Arsenic cell is maintained at a constant effusion rate to provide an arsenic overpressure at all times to avoid decomposition. This processing yields a multilayered single crystal. See FIG. 6A for a cross sectional elevation view.

Figure 6B:
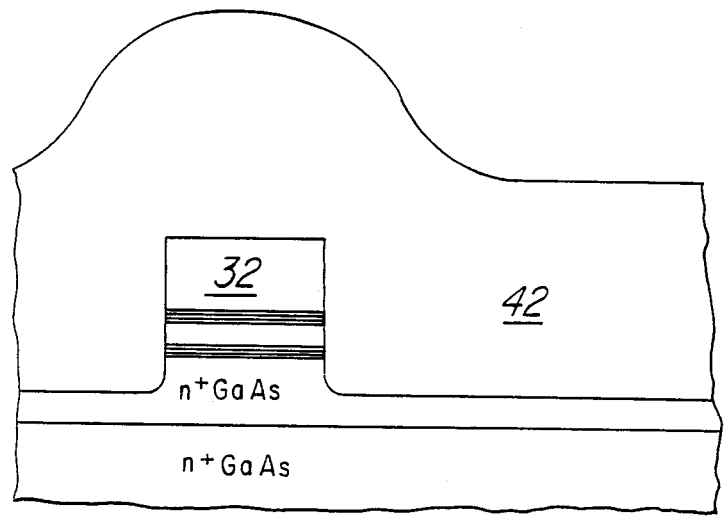

(b) Photoresist is spun on the multilayered crystal and patterned to define the active area (top of cathode 32 in FIG. 2). The patterned photoresist is then used as a mask to reactive ion etch through all the grown layers down into the n+ buffer layer. Then the photoresist is removed and silicon nitride insulator 42 is deposited by plasma CVD. See FIG. 6B.

(c) Insulator 42 is then planarized and etched down to expose cathode 32. Photoresist is spun on and patterned to define an access via 43 through insulator 42 to the n+ GaAs buffer layer, and the via formed by etching and the photoresist ashed. (Alternatively, a backside contact to the substrate could be used rather than the planar device of FIG. 6C.) Lastly, gold:germanium/-nickel/gold contacts 45 and 47 to cathode 32 and anode 40, respectively, are formed by evaporation and liftoff to complete diode 30 except for bonding wires, packaging, etc. See FIG. 6C for a cross sectional elevation view.

Diode 30 has the features of (1) tunneling barriers without alloy scattering because no alloy is used. (2) dopants initially located away from the tunneling barriers and superlattice tunneling barriers so dopant diffusion during processing does not significantly dope the tunneling barriers or quantum well, (3) precise parameters because only binary compositions are grown and the short-period superlattices have layers only two molecular layers thick and thereby take advantage of the integral molecular layer stability during growth, and (4) interface perfection because the superlattice can absorb strains.

Second preferred embodiment diode 130 is similar to diode 30 except that the quantum well is made of $In_xGa_{1-x}As$ with x=0.9. In particular, diode 130 includes the following planar regions in a single crystal: cathode 132 of n+ doped GaAs, tunneling barrier 134 of undoped binary AlAs/GaAs short-period superlattice, quantum well 136 of undoped $In_xGa_{1-x}As$, tunneling barrier 138 of undoped binary AlAs/GaAs short-period superlattice, and anode 140 of n+ doped GaAs.

Figure 7A:
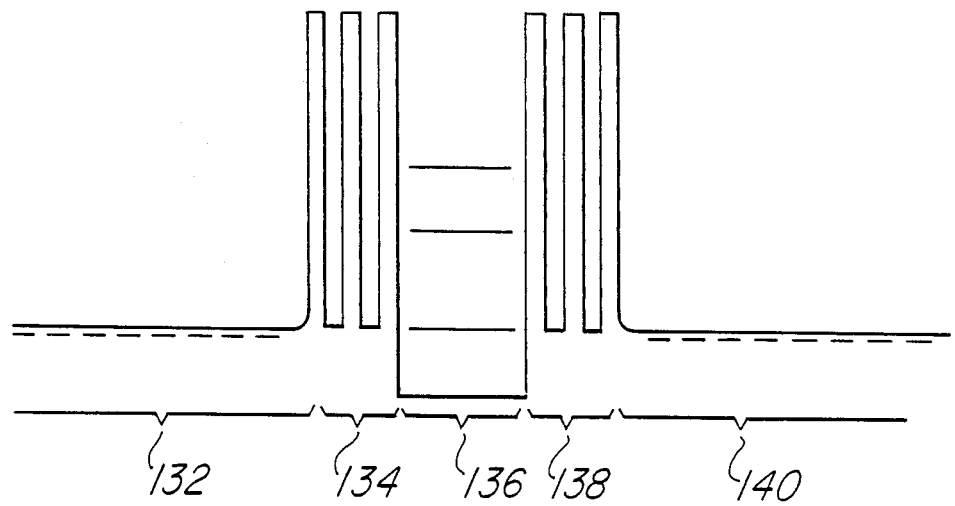
FIGS. 7A-B are conduction band edge diagrams for the second preferred embodiment with zero bias resonance and nonresonance bias.
Figure 7B:
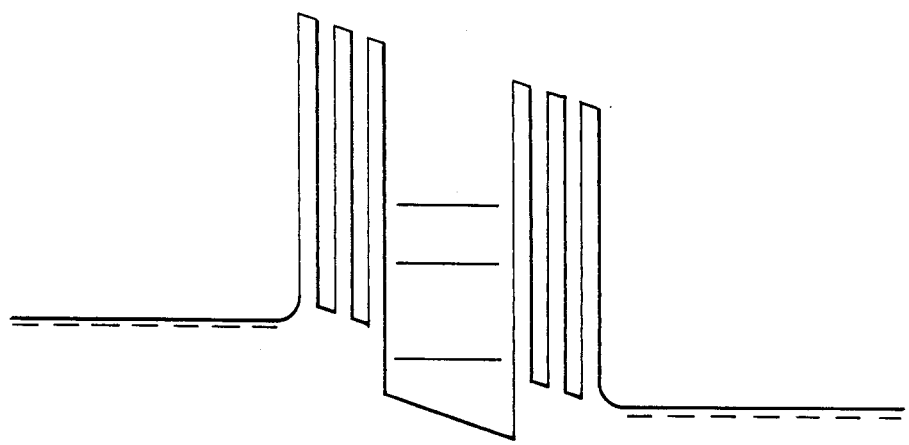

The conduction band alignment for diode 130 is shown in FIG. 7A for no bias and shown in FIG. 7B for a bias of 100 mV. Diode 130 differs from diode 30 and has lowest-energy subband bottom 148 in well 136 at approximately the same energy as electrons in cathode 132 and anode 140 when no bias is applied to diode 130; that is, diode 130 is a depletion-mode device and has low resistance (resonance) for small bias and large resistance (disruption and resonance) for larger bias until resonance with the first excited subband bottom comes into resonance.

MODIFICATIONS AND ADVANTAGES

The dimensions and materials of the preferred embodiment tunneling diodes can be greatly varied while still preserving the features of binary short-period superlattice tunneling barriers. Indeed, the anode and cathode could be alloys with bandgap smaller than the effective bandgap of the tunneling barriers; this could provide an alternative depletion mode device. Further, the device could be asymmetrical and resonance could be reached with a smaller bias in direction than in the other, or even be depletion mode in one direction and enhancement mode in the other. The aluminum gallium arsenide system could be replaced with other systems such as indium arsenide phosphide, mercury cadmium telluride, strained layers of lattice mismatched systems, etc. and still maintain single crystal structures. And other types of resonant tunneling devices could use binary short-period superlattice tunneling barriers, such as three terminal devices with contacts to the quantum well.

Holes instead of electrons could be the carrier, or even both holes and electrons transported in opposite directions simultaneously. The energy levels could be changed by either dimensional changes or material changes or combinations. For example, the wells could have short-period superlattice structure and more strained layers could be used.

The temperature of operation may be adjusted, and this has the effect of expanding or contracting the phonon population and thus the inelastic tunneling rate.

Figure 6C:
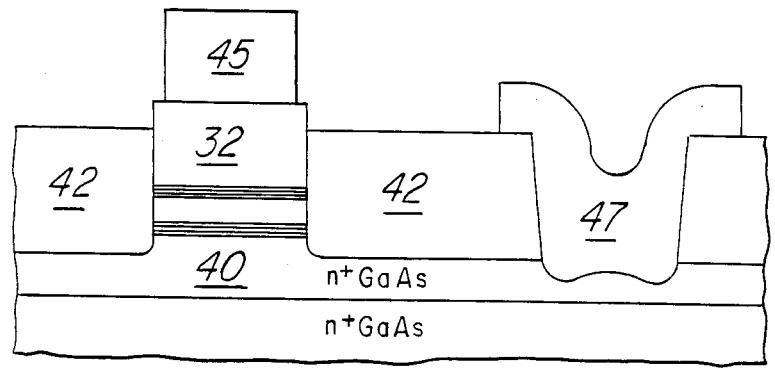

Various geometries are available, such as the planar device of FIG. 6C with interdigitated anode and cathode.

The advantages of the preferred embodiments and modifications include the simple growth procedures and low interface imperfections and alloy scattering for a resonant tunneling device.

What is claimed is:
1. A resonant tunneling device, comprising:
   (a) a planar quantum well made of a first semiconductor material;
   (b) first and second planar tunneling barriers planarly abutting said well, said tunneling barriers each a short-period superlattice of alternating layers of second semiconductor material and third semiconductor material with said second and third materials each a binary compound;
   (c) a first terminal planarly abutting said first tunneling barrier, said first terminal made of doped fourth semiconductor material; and
   (d) a second terminal planarly abutting said second tunneling barrier, said second terminal made of doped fifth semiconductor material;
   (e) wherein the bandgap of said first material is less than the effective bandgap of both of said tunneling barriers, and the bandgap of said fourth material is less than the effective bandgap of said first tunneling barrier, and the bandgap of said fifth material is less than the effective bandgap of said second tunneling barrier;
   (f) whereby resonant tunneling of carriers from said first terminal through a subband in said well into said second terminal is controlled by the bias applied across said terminals.
2. The device of claim 1, wherein:
   (a) said first, third, fourth, and fifth materials are GaAs; and
   (b) said second semiconductor material is AlAs.
3. The device of claim 1, wherein:
   (a) said first material is InGaAs;
   (b) said second material is AlAs; and
   (c) said third, fourth, and fifth materials are GaAs.
4. The device of claim 1, wherein:
   (a) said short-period superlattices each have five layers, with three layers of said second material and two layers of said third material.
5. The device of claim 1, wherein:
   (a) each of said layers in said short-period superlattices is two molecular layers thick.

* * * * *